United States Patent
Su et al.

(10) Patent No.: US 7,452,755 B2
(45) Date of Patent: Nov. 18, 2008

(54) EMBEDDED METAL HEAT SINK FOR SEMICONDUCTOR DEVICE AND METHOD FOR MANUFACTURING THE SAME

(75) Inventors: Yan-Kuin Su, Tainan (TW); Kuan-Chun Chen, Taichung Hsien (TW); Chun-Liang Lin, Tainan Hsien (TW); Jin-Quan Huang, Kaohsiung Hsien (TW); Shu-Kai Hu, Kaohsiung (TW)

(73) Assignee: National Cheng Kung University, Tainan (TW)

( * ) Notice: Subject to any disclaimer, the term of this patent is extended or adjusted under 35 U.S.C. 154(b) by 166 days.

(21) Appl. No.: 11/470,279

(22) Filed: Sep. 6, 2006

(65) Prior Publication Data
US 2007/0296074 A1 Dec. 27, 2007

(30) Foreign Application Priority Data
Jun. 26, 2006 (TW) .............................. 95123020 A (51) Int. Cl.
*H01L 21/44* (2006.01)
*H01L 21/48* (2006.01)

(52) U.S. Cl. ........................................ 438/122; 257/676
(58) Field of Classification Search ................ 438/122, 438/106; 257/676
See application file for complete search history.

(56) References Cited

U.S. PATENT DOCUMENTS

| | | | |
|---|---|---|---|
| 6,287,882 B1 | 9/2001 | Chang et al. | |
| 6,806,112 B1 | 10/2004 | Horng et al. | |
| 6,936,855 B1 * | 8/2005 | Harrah | ........................ 257/88 |
| 6,967,117 B2 | 11/2005 | Horng et al. | |
| 7,157,789 B2 * | 1/2007 | Hirano et al. | ................ 257/659 |

FOREIGN PATENT DOCUMENTS

| | | |
|---|---|---|
| TW | 576554 | 2/2004 |
| TW | 595017 B | 6/2004 |
| TW | 236161 B | 7/2005 |
| TW | 237881 B | 8/2005 |
| TW | 237914 B | 8/2005 |

* cited by examiner

*Primary Examiner*—Theresa T Doan (57) ABSTRACT

An embedded metal heat sink for a semiconductor device and a method for manufacturing the same are described. The embedded metal heat sink for a semiconductor device comprises a metal thin layer, a metal heat sink and two bonding pads. The metal thin layer including a first surface and a second surface on opposite sides, wherein at least one semiconductor device is embedded in the first surface of the metal thin layer, and the semiconductor device has two electrodes with different conductivity types. The metal heat sink is deposited on the second surface of the metal thin layer. The bonding pads are deposed on the first surface of the metal thin layer around the semiconductor device and are respectively corresponding to the electrodes, wherein the electrodes are electrically and respectively connected to the corresponding bonding pads by at least two wires, and the bonding pads are electrically connected to an outer circuit.

10 Claims, 8 Drawing Sheets

EMBEDDED METAL HEAT SINK FOR SEMICONDUCTOR DEVICE AND METHOD FOR MANUFACTURING THE SAME

RELATED APPLICATIONS

The present application is based on, and claims priority from, Taiwan Application Serial Number 95123020, filed Jun. 26, 2006, the disclosure of which is hereby incorporated by reference herein in its entirety.

FIELD OF THE INVENTION

The present invention relates to a metal heat sink and a method for manufacturing the same, and more particularly, to an embedded metal heat sink for an opto-electrical device and a method for manufacturing the same.

BACKGROUND OF THE INVENTION

When small solid state opto-electrical devices, such as light-emitting diodes (LEDs) or laser diodes (LDs), are applied in a large or small backlight module or illumination module, many opto-electrical devices are needed to generate sufficient brightness or illumination for the modules. However, when the opto-electrical devices are operated at high power, the temperature of the module composed of the opto-electrical devices increases, thereby degrading the operational quality of the module and ultimately burning out the opto-electrical devices.

To resolve this high temperature issue, the module composed of the opto-electrical devices is typically cooled by fans set in the module or by increasing the heat dissipation area. However, regarding setting fans in the module, the vibration caused by the operation of the fans results in the lights flickering, and the fans consume additional power. Regarding increasing the heat dissipation area, although the heat sinks can be composed of metal with high thermal conductivity, glue mixed with metal is used to connect the opto-electrical device and the heat sinks, and the thermal conductivity of the glue is much lower than that of the pure metal. As a result, the heat generated during the operation of the opto-electrical device mostly accumulates at the connection interface, so that the heat sinks cannot transfer heat well, thereby making the heat sinks less effective, and easily damaging the opto-electrical devices during long-term operation or ultimately making the opto-electrical devices being operated with larger input power usage.

In addition, the heat sinks are typically connected to a circuit board with glue for electrically connecting the opto-electrical device and an outer circuit. Accordingly, the heat generated during the operation of the device accumulates at the glue, and the thermal conductivity of the circuit board composed of the plastic material is low, so the heat conductivity rate is low and greatly decreases the heat dissipation efficiency of the heat sinks.

Therefore, with the increasing demand for opto-electrical devices, such as light-emitting diodes and laser diodes, for backlight modules and illumination modules, a technique for manufacturing an opto-electrical device with high heat-sinking efficiency is required.

SUMMARY OF THE INVENTION

One aspect of the present invention is to provide an embedded metal heat sink for a semiconductor device, in which the embedded metal heat sink includes at least one bonding pad used as a transition electrode for electrically connecting a positive electrode or a negative electrode of the semiconductor device and an outer circuit, so that the semiconductor device embedded on the metal heat sink can be successfully connected to the outer circuit.

Another aspect of the present invention is to provide a method for manufacturing an embedded metal heat sink for a semiconductor device, in which the metal heat sink can be directly deposited on a bottom surface of the semiconductor device with the assistant of an adhesive tape and without the use of glue or a pasting technique. In addition, bonding pads are deposed on the metal heat sink surrounding the semiconductor device for the electrical transition between electrodes of the semiconductor device and an outer circuit. Therefore, the temperature of the operating device can be rapidly and effectively lowered for improving the operational quality of the device and prolonging the life of the device, and the positive electrode and the negative electrode of the semiconductor device can be successfully connected to the outer circuit, thereby saving the using of a circuit board.

According to the aforementioned aspects, the present invention provides an embedded metal heat sink for a semiconductor device, comprising: a metal thin layer including a first surface and a second surface on opposite sides, wherein at least one semiconductor device is embedded in the first surface of the metal thin layer, and the semiconductor device has two electrodes with different conductivity types; a metal heat sink deposited on the second surface of the metal thin layer; and two bonding pads deposed on the first surface of the metal thin layer around the semiconductor device and respectively corresponding to the electrodes, wherein the electrodes are electrically and respectively connected to the corresponding bonding pads by at least two wires, and the bonding pads are electrically connected to an outer circuit.

According to the aforementioned aspects, the present invention further provides a method for manufacturing an embedded metal heat sink for a semiconductor device, comprising: providing an adhesive tape, wherein the adhesive tape includes a first surface and a second surface on opposite sides, and the first surface of the adhesive tape adheres to a surface of a temporary substrate; providing at least one semiconductor device, wherein the semiconductor device includes a first side and a second side opposite to the first side, the first side of the semiconductor device is pressed and set into a portion of the second surface of the adhesive tape to expose the second side of the semiconductor device, and the semiconductor device has two electrodes with different conductivity types; forming a thin metal layer on the second side of the semiconductor device and the exposed portion of the second surface of the adhesive tape, wherein a portion of a surface of the thin metal layer contacts with the second side of the semiconductor device; forming a metal heat sink on the thin metal layer; removing the adhesive tape and the temporary substrate to expose the semiconductor device and the surface of the thin metal layer; and deposing a plurality of bonding pads on the exposed portion of the surface of the thin metal layer around the semiconductor device, wherein the bonding pads respectively correspond to the electrodes of the semiconductor device, and the electrodes are electrically connected to the corresponding bonding pads through at least two wires.

According to a preferred embodiment of the present invention, a material of the metal heat sink may be Fe/Ni alloy, Cu, Ni, Al, W or an alloy thereof, and each bonding pad includes an insulating layer and a conductive layer deposited on the insulating layer, wherein the insulating layer is adhered to the first surface of the thin metal layer.

A semiconductor device is directly embedded into a metal heat sink by directly forming the metal heat sink on the semiconductor device. Then, bonding pads are deposed on the metal heat sink around the semiconductor device for the transition of the electrical connection between the electrodes of the semiconductor device and an outer circuit. As a result, the metal heat sink cannot be additionally deposed on a circuit board, thereby greatly increasing the heat-sinking efficiency, enhancing the operation stability of the device and effectively prolonging the life of the device.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein:

FIGS. 1A through 8 are schematic flow diagrams showing the process for manufacturing an embedded metal heat sink for a semiconductor device in accordance with a preferred embodiment of the present invention, wherein the schematic flow diagrams includes cross-sectional views and the corresponding top views.

DETAILED DESCRIPTION OF THE PREFERRED EMBODIMENT

The present invention discloses an embedded metal heat sink for a semiconductor device and a method for manufacturing the same, in which electrodes of the semiconductor device are in contact with an outer circuit, and the heat-sinking efficiency of the metal heat sink is increased to improve the heat-dissipating problem of the semiconductor device. In order to make the illustration of the present invention more explicit, the following description is stated with reference to FIGS. 1A through 8.

Figure 1A:
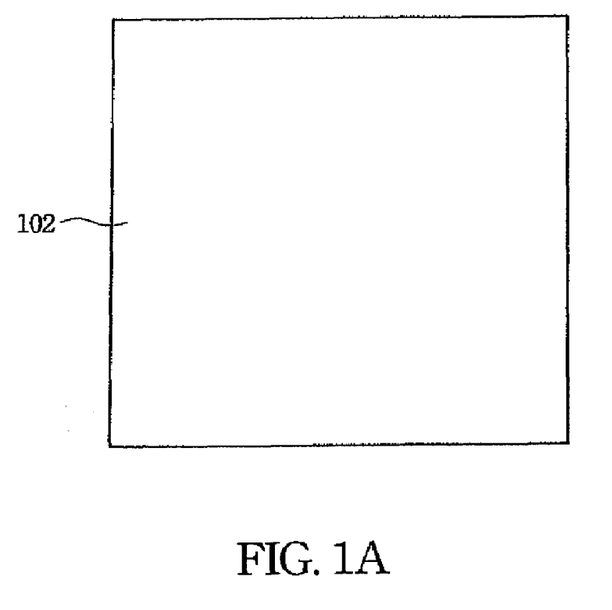
Figure 1B:
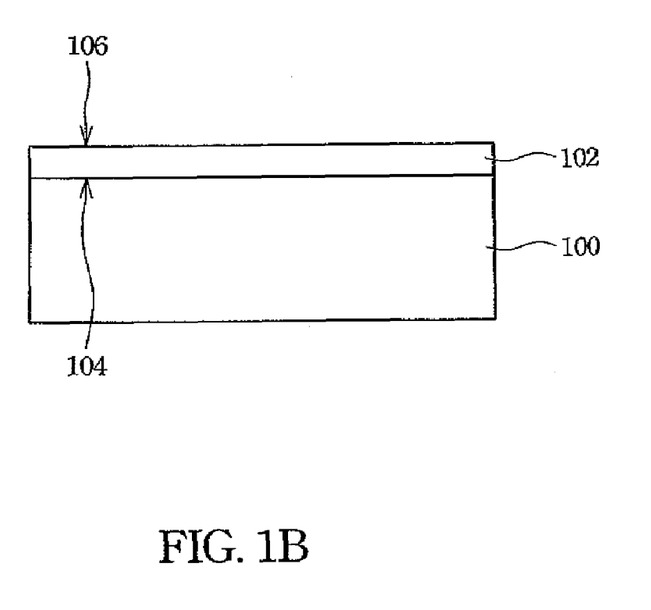

FIGS. 1A through 8 are schematic flow diagrams showing the process for manufacturing an embedded metal heat sink for a semiconductor device in accordance with a preferred embodiment of the present invention, wherein the schematic flow diagrams includes cross-sectional views and the corresponding top views. In the manufacturing of an embedded metal heat sink of a semiconductor device of the present invention, a temporary substrate 100 and an adhesive tape 102 are initially provided, and the adhesive tape 102 is adhered to the temporary substrate 100 to make a surface 104 of the adhesive tape 102 contact with a surface of the temporary substrate 100, such as shown in FIGS. 1A and 1B, of which FIG. 1A is the top view and FIG. 1B is the corresponding cross-sectional view. The adhesive tape 102 includes another surface 106 opposite the surfaces 104. The adhesive tape 102 is preferably composed of an acid-proof and alkali-proof material, and the adhesive tape 102 has a thickness greater than about 10 μm. In a preferred embodiment of the present invention, the adhesive tape 102 preferably has a thickness of about 100 μm and is a double-sided adhesive tape, that is, surface 104 and surface 106 of the adhesive tape 102 are both adhesive. However, in the present invention, if the adhesive tape 102 is composed of a soft plastic material, only the surface 104 might be adhesive while the surface 106 is not adhesive.

Figure 2A:
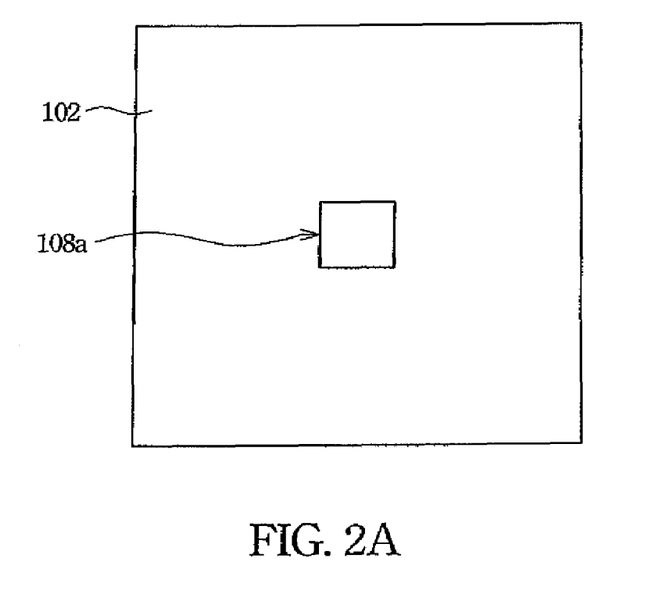
Figure 2B:
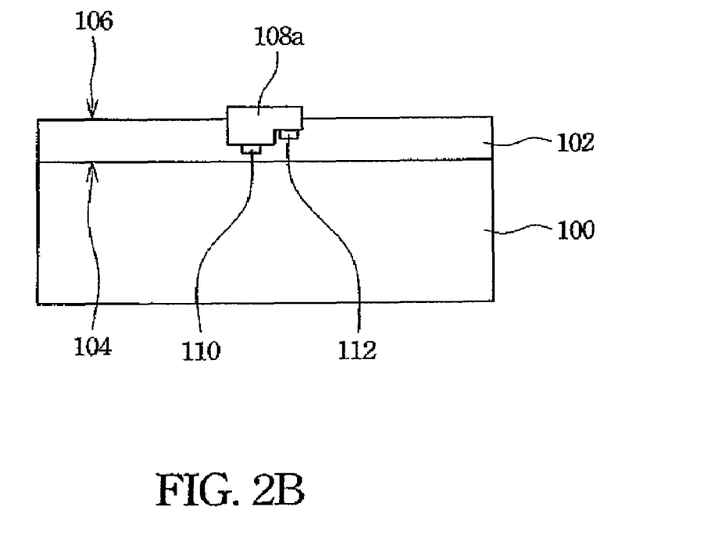
Figure 2C:
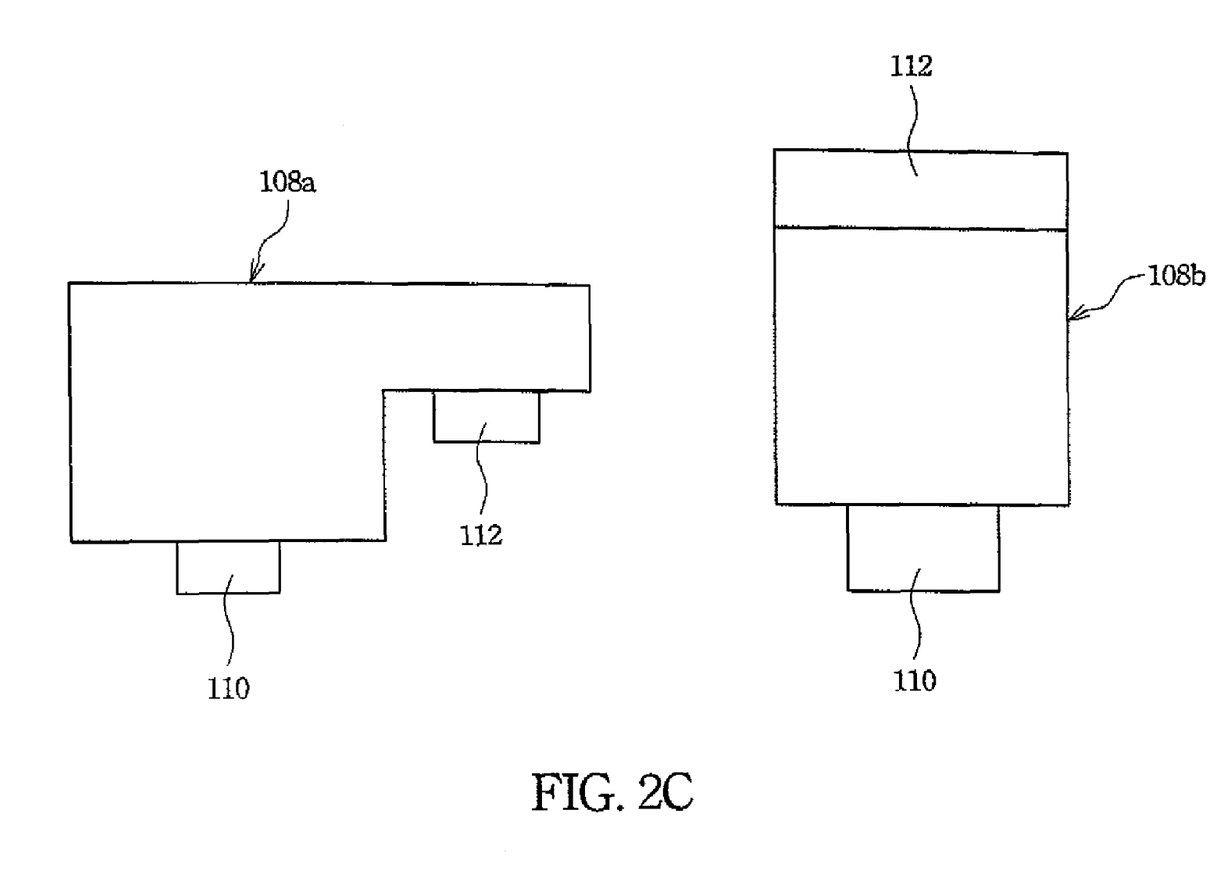

Then, one or more semiconductor devices are provided, wherein the semiconductor devices are composed of compound semiconductor materials, such as GaN-based materials, AlGaInP-based materials, PbS-based materials or SiC-based materials, and the semiconductor devices are, for example, transistors, monolithic ICs, or opto-electrical devices, such as light-emitting diodes or laser diodes. Each semiconductor device includes two electrodes of different conductivity types, wherein the electrodes are deposed on the same side or on different sides of the semiconductor device, such as opto-electrical devices 108a and 108b shown in FIG. 2C. In the exemplary embodiment, two electrodes 110 and 112 of the opto-electrical device 108a are deposed on the same side of the opto-electrical device 108a; and two electrodes 110 and 112 of the opto-electrical device 108b are deposed on two opposite sides of the opto-electrical device 108b. While the electrode 110 is N-type, the electrode 112 is P-type; and while the electrode 110 is P-type, the electrode 112 is N-type. In the exemplary embodiment, the opto-electrical device 108a is adapted for the semiconductor device. A side of the opto-electrical device 108a is pressed downward on the surface 106 of the adhesive tape 102 to make the opto-electrical device 108a adhere to or embbeded into the surface 106 of the adhesive tape 102 and to expose the side of opto-electrical device 108a opposite to the adhered side, wherein the side of the opto-electrical device 108a pressed into the adhesive tape 102 are set with two electrodes 110 and 112, such as shown in FIGS. 2A and 2B, wherein FIG. 2A is the top view and FIG. 2B is the corresponding cross-sectional view. In the present invention, the adhered side of the opto-electrical device 108a is pressed into the adhesive tape 102 has to be set with at least one electrode to prevent the two electrodes from electrically connecting. When many opto-electrical devices 108a are processed at the same time, these opto-electrical devices 108a can be arranged according to the process requirements.

In the present invention, the opto-electrical devices 108a may be GaN-based light-emitting diodes, AlGaInP-based light-emitting diodes, PbS-based light-emitting diodes or SiC-based light-emitting diodes. In another embodiment, the opto-electrical devices 108a may be GaN-based laser diodes, AlGaInP-based laser diodes, PbS-based laser diodes or SiC-based laser diodes.

Figure 3A:
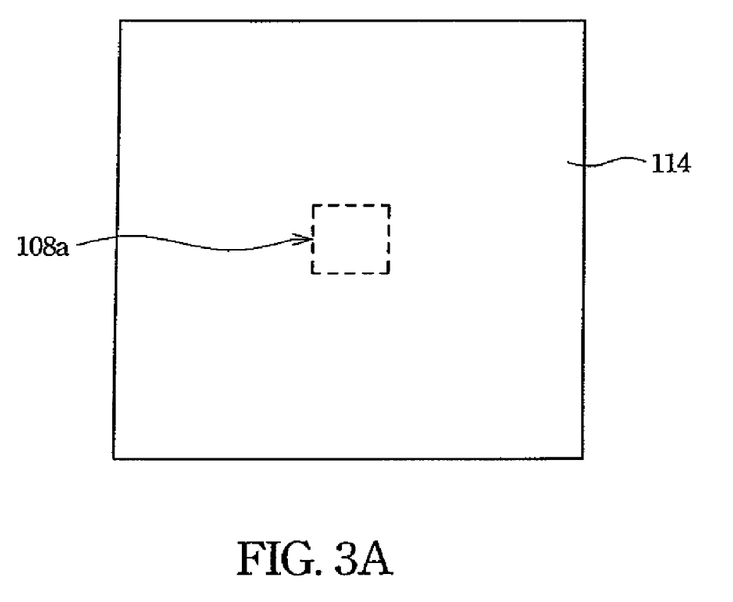
Figure 3B:
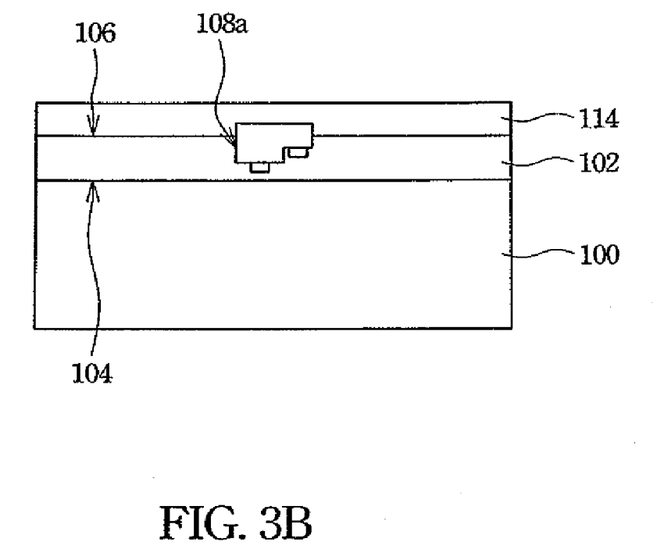

After the opto-electrical device 108a is fixed in the adhesive tape 102, a thin metal layer 114 is directly formed to cover the exposed surface of the opto-electrical device 108a and the exposed region in the surface 106 of the adhesive tape 102 by, for example, an evaporation deposition method, a sputtering deposition method or an electroless plating deposition method, such as shown in FIGS. 3A and 3B, in which FIG. 3A is the top view and FIG. 3B is the corresponding cross-sectional view. In the present invention, the thin metal layer 114 is preferably composed of a metal material with good adhesion, such as Ni, Cr, Ti, or an alloy thereof, to facilitate the deposition of the metal material. Besides, the thin metal layer 114 may be composed of a metal material of high reflectivity, such as Ag, Pt, Al, Au, Ni, Ti, or an alloy thereof. In the present invention, the thin metal layer 114 may be composed of a single-layered metal structure, or may be composed of a multi-layered metal structure. A thickness of the thin metal layer 114 is preferably less than about 10 μm. In an exemplary embodiment, the thickness of the thin metal layer 114 is about 10 nm.

Figure 4A:
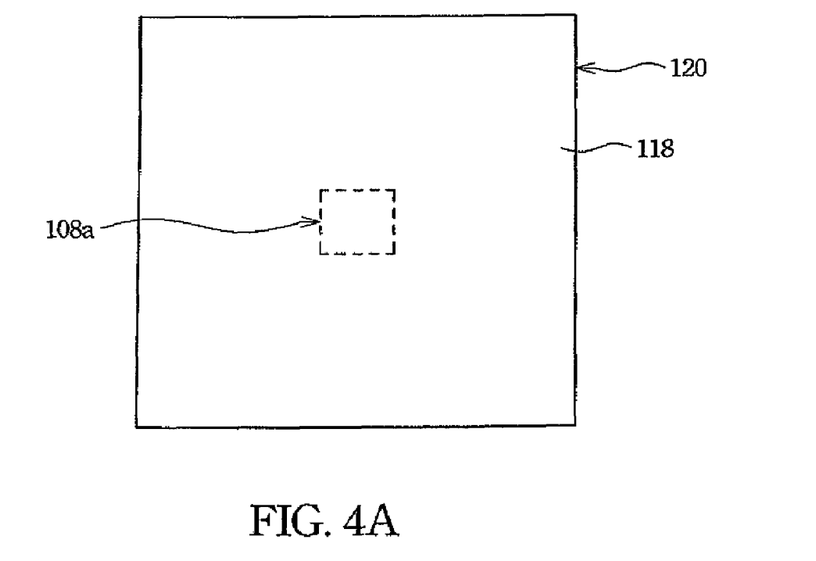
Figure 4B:
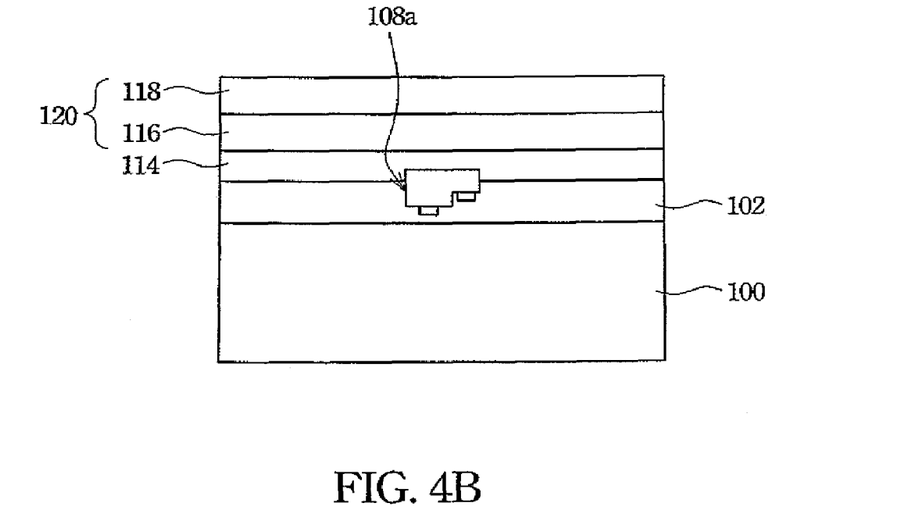

After the thin metal layer 120 is formed, a heat sink of the semiconductor device may be formed directly, or a light-reflecting structure is selectively formed on the semiconductor device according to the product needs, such as the semiconductor device is an opto-electrical device, for increasing the light extraction of the opto-electrical device. In the embodiment, a reflective layer 120 is formed to cover the thin metal layer 114 on the opto-electrical device 108a by, for example, an evaporation deposition method, a sputtering deposition method, an electroless plating deposition method or an electro plating deposition method, wherein the reflective layer 120 is preferably composed of a metal material of good reflectivity, such as Ag, Pt, Al, Au, Ni, Ti, or an alloy thereof, and the reflective layer 120 may be composed of a single-layered metal structure or a multi-layered metal structure. As shown in FIGS. 4A and 4B, in the preferred embodiment, the reflective layer 120 is composed of a silver film 116 and a gold film 118 stacked on the thin metal layer 114 in sequence, wherein a thickness of the silver film 116 is about 300 nm, and a thickness of the gold film 118 is about 150 nm. In the present invention, a thickness of the reflective layer 120 is preferably less than about 10 μm. However, when the thin metal layer 114 is composed of a metal material of high reflectivity, the thin metal layer 114 can provide light-reflecting function, and a reflective layer may not be additionally formed.

Figure 5A:
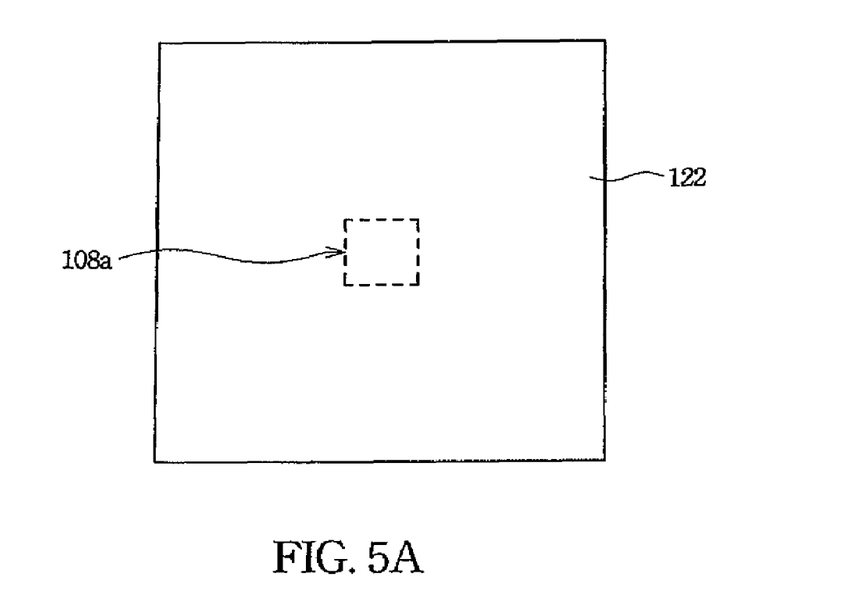
Figure 5B:
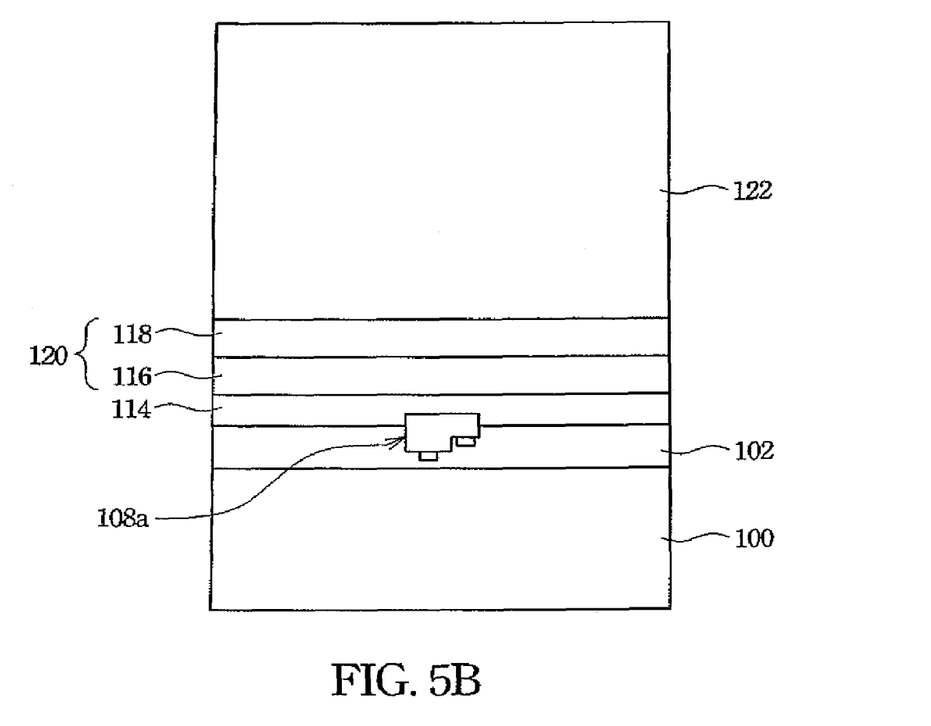

Then, a metal heat sink 122 is formed to cover the reflective layer 120 by, for example, a plating method or an electroless plating method, wherein the metal heat sink 122 is composed of a thicker metal layer for providing larger heat conduction, such as shown in FIGS. 5A and 5B, in which FIG. 5A is the top view and FIG. 5B is the corresponding cross-sectional view. Because the metal heat sink 122 is formed by a plating method or an electroless plating method in the present invention, the metal heat sink 122 is substantially grown on the reflective layer 120. The metal heat sink 122 is preferred composed of a metal of good thermal conductivity, such as Fe/Ni alloy, Cu, Ni, Al, W, or an alloy thereof. The metal heat sink 122 is generally thicker and preferably has a thickness greater than about 10 μm for larger heat conduction. In an embodiment of the present invention, a thickness of the metal heat sink 122 is preferably about 3 mm.

One feature of the present invention is that the thin metal layer is initially formed by an evaporation deposition method, a sputtering deposition method or an electroless plating deposition method and is used as the base for plating or electroless plating the metal heat sink, and a reflective layer is selectively formed according to the needs of the semiconductor device for increasing the light extraction efficiency of the opto-electrical device. With only one single adhesive tape used, the metal heat sink can be formed on the bottom surface of the semiconductor device. As a result, the present process is very simple, and the standard process equipment can still be used, thereby preventing increasing the process cost. Furthermore, the semiconductor device is embedded in the surface of the metal heat sink, with no glue between the semiconductor device and the metal heat sink, thereby greatly increasing the heat-transmitting area and the heat-transmitting speed of the semiconductor device.

Figure 6:
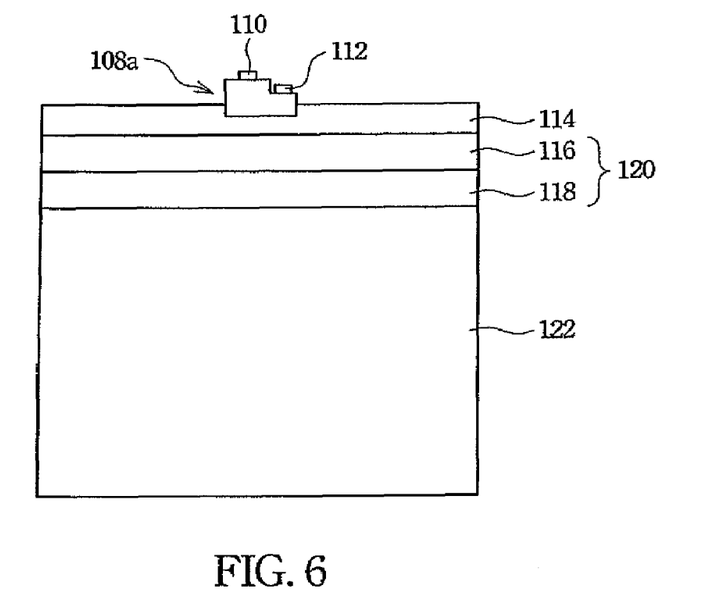

After the metal heat sink 122 is formed, the adhesive tape 102 and the temporary substrate 100 are removed to expose a side of the opto-electrical device 108a, the electrodes 110 and 112 deposed on the side of the opto-electrical device 108a, and the surface at the side of the thin metal layer 114 where the opto-electrical device 108a located, such as shown in FIG. 6. Because the thin metal layer 114 and the opto-electrical device 108a are adhered to the temporary substrate 100 by the adhesive tape 102, the metal heat sink 122, the thin metal layer 114 and the opto-electrical device 108a can be separated from the temporary substrate 100 easily.

Figure 7:
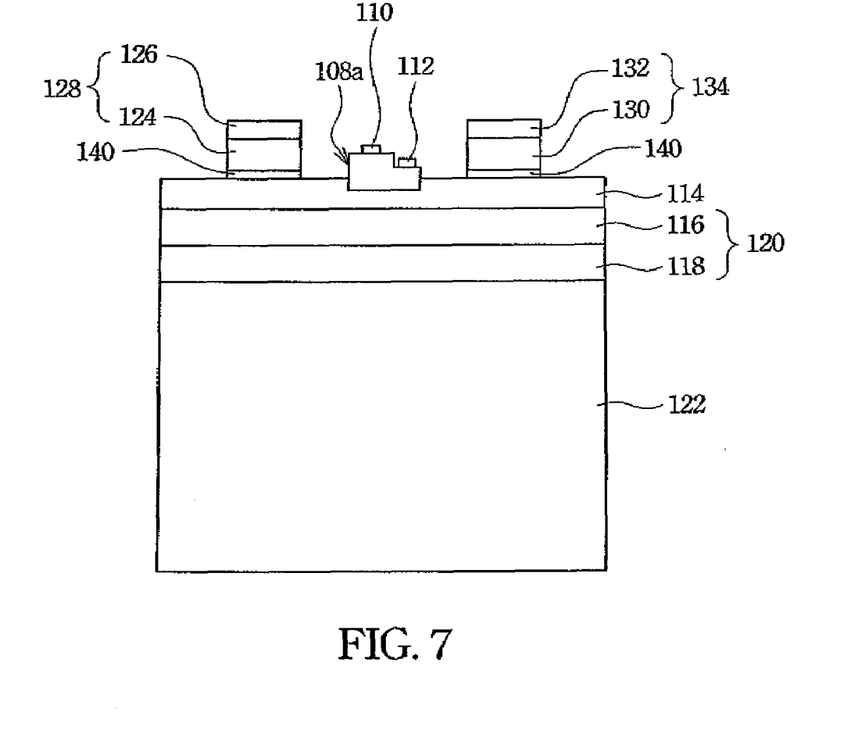

Next, a plurality of bonding pads 128 and 134 are adhered to the exposed surface of the thin metal layer 114 around the opto-electrical device 108a through the glue 140 by an adhesive method, such as shown in FIG. 7. The bonding pad 128 mainly includes an insulating layer 124 and a conductive layer 126, wherein the insulating layer 124 is adhered to the surface of the thin metal layer 114 through the adhesive glue 140, and the conductive layer 126 is deposed on the insulating layer 124. Similarly, the bonding pad 134 mainly includes an insulating layer 130 and a conductive layer 132, wherein the insulating layer 130 is adhered to the surface of the thin metal layer 114 through the adhesive glue 140, and the conductive layer 132 is deposed on the insulating layer 130. In the present invention, each semiconductor device at least includes two electrodes of different conductivity types, so that each semiconductor device preferably correspond to two bonding pads, that is, each electrode corresponds to one bonding pad.

Figure 8:
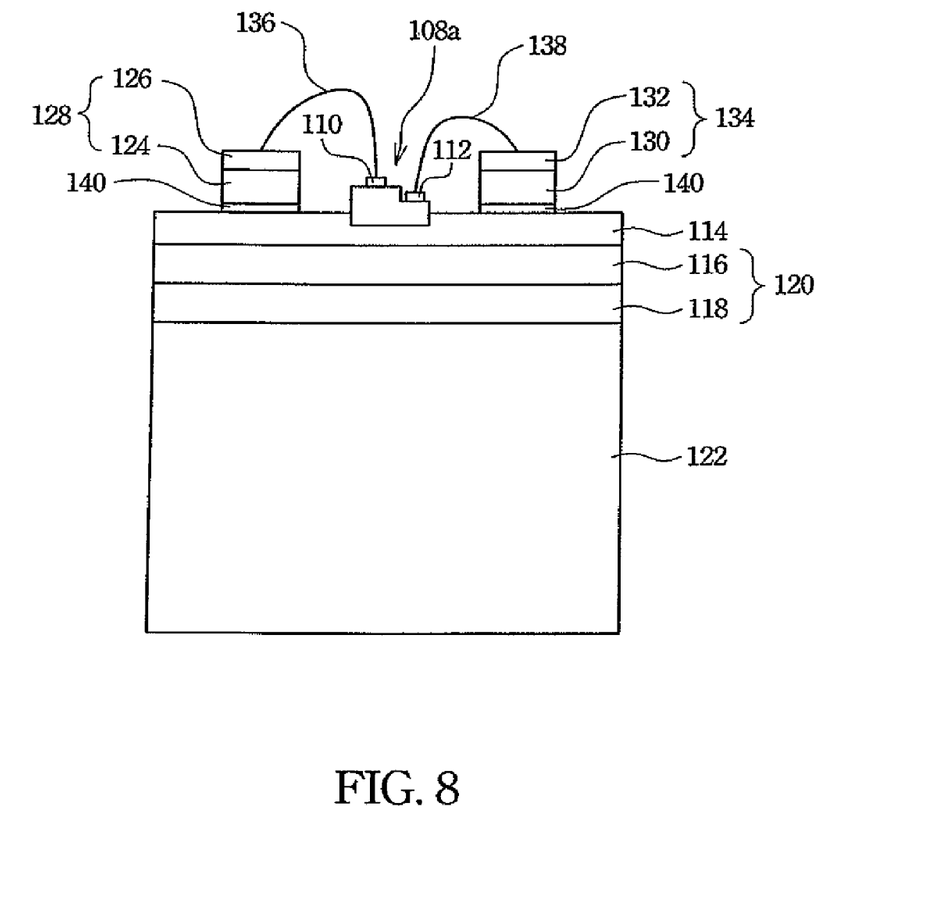

Subsequently, at least two wires 136 and 138 are formed to respectively connect the electrode 110 of the opto-electrical device 108a and the conductive layer 126 of the bonding pad 128, and the electrode 112 and the conductive layer 132 of the bonding pad 134, for electrically connecting the electrode 110 and the bonding pad 128, and the electrode 112 and the bonding pad 134 respectively, such as shown in FIG. 8. In the present invention, the electrode and the bonding pad of the same conductivity types may be connected by one or more wires. For example, the positive electrode may be connected to the positive bonding pad by four wires, and the negative electrode may be connected to the negative bonding pad by three wires. Therefore, at least one wire must be set between each conductivity type electrode and the bonding pad of the same conductivity type, and the number of connection wires between the electrode and the bonding pad of the same conductivity type can be modified according to the requirements of the device design. Because wires of an outer circuit (not shown) are bigger, and the sizes of the electrodes 110 and 112 of the semiconductor device, such as the opto-electric device 108a, are smaller, so that it is unfavorable for the outer circuit being directly connected to the electrodes 110 and 112. Therefore, with the installation of the bonding pads 128 and 134, which are much larger than the electrodes 110 and 112 in size, the outer circuit can be easily connected to the electrodes 110 and 112. By deposing the transitive bonding pads 128 and 134 on the surface of the thin metal layer 114 around the opto-electrical device 108a and using a wire bonding technique, the electrodes 110 and 112 of the opto-electrical device 108a can be successfully and electrically connected to the outer circuit, which is connected to the bonding pads 128 and 134, respectively through the wire 136 and the bonding pad 128, and the wire 138 and the bonding pad 134 without using a circuit board.

Another feature of the present invention is that the bonding pads are deposed on the metal heat sink for transition, so that it is beneficial for the electrical connection between the electrodes of the semiconductor device and the outer circuit, so that a circuit board is unnecessary. Furthermore, the heat dissipating function of the metal heat sink can be completely elaborated since the metal heat sink does not need to be deposed on the circuit board.

According to the aforementioned description, one advantage of the present invention is that the embedded metal heat sink for the semiconductor device of the present invention includes at least one bonding pad, and the at least one bonding pad can be used as a transition electrode for electrically connecting a positive electrode or a negative electrode of the semiconductor device and an outer circuit, so that the semiconductor device embedded on the metal heat sink can be successfully connected to the outer circuit, and an circuit can be omitted.

According to the aforementioned description, another advantage of the present invention is that the semiconductor device of the present invention can be electrically connected to an outer circuit successfully without pasting the embedded metal heat sink for the semiconductor device to a circuit board, so that the heat sinking efficiency of the metal heat sink can effectively work out.

According to the aforementioned description, still another advantage of the present invention is that in the method for manufacturing an embedded metal heat sink for a semiconductor device, the metal heat sink can be directly deposited on a bottom surface of the semiconductor device with the assistant of an adhesive tape and without the use of glue or a pasting technique, so that the process is simple and has high reliability, the temperature of the operating device can be rapidly and effectively lowered to enhance the operational quality of the device and prolonging the life of the device.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an embedded metal heat sink for a semiconductor device, comprising:
    providing an adhesive tape, wherein the adhesive tape includes a first surface and a second surface on opposite sides, and the first surface of the adhesive tape is adhered to a surface of a temporary substrate;
    providing at least one semiconductor device, wherein the at least one semiconductor device includes a first side and a second side opposite to the first side, the first side of the at least one semiconductor device is pressed and set into a portion of the second surface of the adhesive tape to expose the second side of the semiconductor device, and the semiconductor device has two electrodes with different conductivity types;
    forming a thin metal layer on the second side of the at least one semiconductor device and the exposed portion of the second surface of the adhesive tape, wherein a portion of a surface of the thin metal layer contacts with the second side of the at least one semiconductor device;
    forming a metal heat sink on the thin metal layer;
    removing the adhesive tape and the temporary substrate to expose the at least one semiconductor device and the surface of the thin metal layer; and
    deposing a plurality of bonding pads on the exposed portion of the surface of the thin metal layer around the at least one semiconductor device, wherein the bonding pads are respectively corresponding to the electrodes of the at least one semiconductor device, and the electrodes are electrically connected to the corresponding bonding pads through at least two wires.

2. The method for manufacturing an embedded metal heat sink for a semiconductor device according to claim 1, wherein the first surface and the second surface of the adhesive tape are both adhesive.

3. The method for manufacturing an embedded metal heat sink for a semiconductor device according to claim 1, wherein the adhesive tape is composed of an acid-proof and alkali-proof material.

4. The method for manufacturing an embedded metal heat sink for a semiconductor device according to claim 1, wherein the thin metal layer is composed of a metal material of good adhesion or a metal material of high reflectivity, wherein the metal material of good adhesion is Ni, Cr, Ti, or an alloy thereof, and the metal material of high reflectivity is Ag, Pt, Al, Au, Ni, Ti, or an alloy thereof.

5. The method for manufacturing an embedded metal heat sink for a semiconductor device according to claim 1, wherein a thickness of the thin metal layer is less than about 10 μm.

6. The method for manufacturing an embedded metal heat sink for a semiconductor device according to claim 1, wherein the step of forming the thin metal layer is performed by an evaporation deposition method, a sputtering deposition method or an electroless plating deposition method.

7. The method for manufacturing an embedded metal heat sink for a semiconductor device according to claim 1, wherein a material of the metal heat sink is Fe/Ni alloy, Cu, Ni, Al, W, or an alloy thereof.

8. The method for manufacturing an embedded metal heat sink for a semiconductor device according to claim 1, wherein the step of forming the metal heat sink is performed by a plating method or an electroless plating method.

9. The method for manufacturing an embedded metal heat sink for a semiconductor device according to claim 1, wherein each bonding pad comprises:
    an insulating layer adhered to the first surface of the thin metal layer; and
    a conductive layer deposed on the insulating layer.

10. The method for manufacturing an embedded metal heat sink for a semiconductor device according to claim 1, further comprising forming a reflective layer on the thin metal layer between the step of forming the thin metal layer and the step of forming the metal heat sink.

* * * * *